(12) United States Patent
Summa et al.

(10) Patent No.: US 7,830,440 B2
(45) Date of Patent: Nov. 9, 2010

(54) INTERLINE CCD IMPLEMENTATION OF HYBRID TWO COLOR PER PIXEL ARCHITECTURE

(75) Inventors: Joseph R. Summa, Hilton, NY (US); Herbert J. Erhardt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 51 days.

(21) Appl. No.: 12/168,186

(22) Filed: Jul. 7, 2008

(65) Prior Publication Data

US 2008/0265288 A1 Oct. 30, 2008

Related U.S. Application Data

(60) Provisional application No. 10/665,035, filed on Sep. 17, 2003, now Pat. No. 7,423,681.

(51) Int. Cl.
*H04N 3/14* (2006.01)
*H04N 5/335* (2006.01)
*H04N 9/04* (2006.01)
*H04N 9/083* (2006.01)

(52) U.S. Cl. .................. 348/323; 348/273; 348/322

(58) Field of Classification Search ......... 348/319–323, 348/272; 257/440
See application file for complete search history.

(56) References Cited

U.S. PATENT DOCUMENTS

| | | | |
|---|---|---|---|
| 4,613,895 A | 9/1986 | Burkey et al. | |
| 5,965,875 A | 10/1999 | Merrill | |
| 6,566,723 B1 * | 5/2003 | Vook et al. | 257/440 |
| 6,930,716 B2 * | 8/2005 | Yoshida | 348/322 |
| 7,218,347 B2 * | 5/2007 | Shinohara | 348/272 |
| 7,626,620 B2 * | 12/2009 | Inoue | 348/272 |
| 7,663,167 B2 * | 2/2010 | Ladd | 257/291 |
| 2003/0128279 A1 * | 7/2003 | Suzuki | 348/221.1 |
| 2003/0189656 A1 | 10/2003 | Shinohara | |

* cited by examiner

*Primary Examiner*—Sinh Tran
*Assistant Examiner*—Albert H Cutler
(74) *Attorney, Agent, or Firm*—Nancy R. Simon

(57) ABSTRACT

An image sensor includes at least first and second photo-sensitive regions; a color filter array having at least two different colors that selectively absorb specific bands of wavelengths, and the two colors respectively span portions of predetermined photo-sensitive regions; and wherein the two photo sensitive regions are doped so that electrons that are released at two different depths in the substrate are collected in two separate regions of the photo sensitive regions so that, when wavelengths of light pass through the color filter array, light is absorbed by the photo sensitive regions which photo sensitive regions consequently releases electrons at two different depths of the photo sensitive regions and are stored in first and second separate regions; at least two charge-coupled devices adjacent the first photo sensitive regions; and a first transfer gate associated with the first photo sensitive region that selectively passes charge at first and second levels which, when at the first level, causes the charge stored in the first region to be passed to one of its associated charge-coupled devices, and when the transfer gate is at the second level, charge stored in the second region is passed to one of the associated charge-coupled devices.

1 Claim, 5 Drawing Sheets

INTERLINE CCD IMPLEMENTATION OF HYBRID TWO COLOR PER PIXEL ARCHITECTURE

CROSS REFERENCE TO RELATED APPLICATIONS

This is a divisional of application Ser. No. 10/665,035 filed Sep. 17, 2003, now U.S. Pat. No. 7,423,681 now allowed.

FIELD OF THE INVENTION

The invention relates generally to the field of transfer gates for image sensors and, more particularly, to a transfer gate having a plurality of transfer voltage levels so that adjacent photosensitive areas can be selectively transferred to associated charge-coupled devices.

BACKGROUND OF THE INVENTION

Current image sensors use a variety of methods for creating color separation. One such method uses the differences in absorption length in silicon of light of different wavelengths for color separation, such as in U.S. Pat. Nos. 5,965,875 and 4,613,895. In this regard, the incoming light is stored in separate regions of the substrate according to its wavelength, and the pixels are arranged so that each pixel receives each color at distinct depths of the silicon.

Another method of producing color separation in image sensors uses color filter arrays. In this regard, color filters are placed over the image sensor, and the color filter separates the incoming light so that particular colors are directed onto particular portions of the image sensor, such as is used in the well-known Bayer pattern. In this arrangement, each pixel receives only one color so that interpolation is needed when the entire image is created therefrom.

In U.S. application Ser. No. 10/636,410, filed Aug. 7, 2003, titled HYBRID TWO COLOR PER PIXEL ARCHITECTURE USING BOTH COLOR FILTER MATERIALS AND WAVELENGTH DEPENDENT SILICON ABSORPTION, by Summa (now abandoned), the above methods are combined so that one photosensitive area receives each color at predefined depths.

Although the above method is satisfactory, they include drawbacks. Color cross-talk is an undesirable inherent feature of the above methods. Therefore, an apparatus and method are needed for overcoming the above drawback.

SUMMARY OF THE INVENTION

The present invention is directed to overcoming one or more of the problems set forth above. Briefly summarized, according to one aspect of the present invention, the invention resides in an image sensor having (a) at least first and second photo-sensitive regions; (b) a color filter array having at least two different colors that selectively absorb specific bands of wavelengths, and the two colors respectively span portions of predetermined photo-sensitive regions; and wherein the two photo sensitive regions are doped so that electrons that are released at two different depths in the substrate are collected in two separate regions of the photo sensitive regions so that, when wavelengths of light pass through the color filter array, light is absorbed by the photo sensitive regions which photo sensitive regions consequently releases electrons at two different depths of the photo sensitive regions and are stored in first and second separate regions; (c) at least two charge-coupled devices adjacent the first photo sensitive regions; and (d) a first transfer gate associated with the first photo sensitive region that selectively passes charge at first and second levels which, when at the first level, causes the charge stored in the first region to be passed to one of its associated charge-coupled devices, and when the transfer gate is at the second level, charge stored in the second region is passed to one of the associated charge-coupled devices.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of substantially preventing cross-talk.

DETAILED DESCRIPTION OF THE INVENTION

Figure 1:
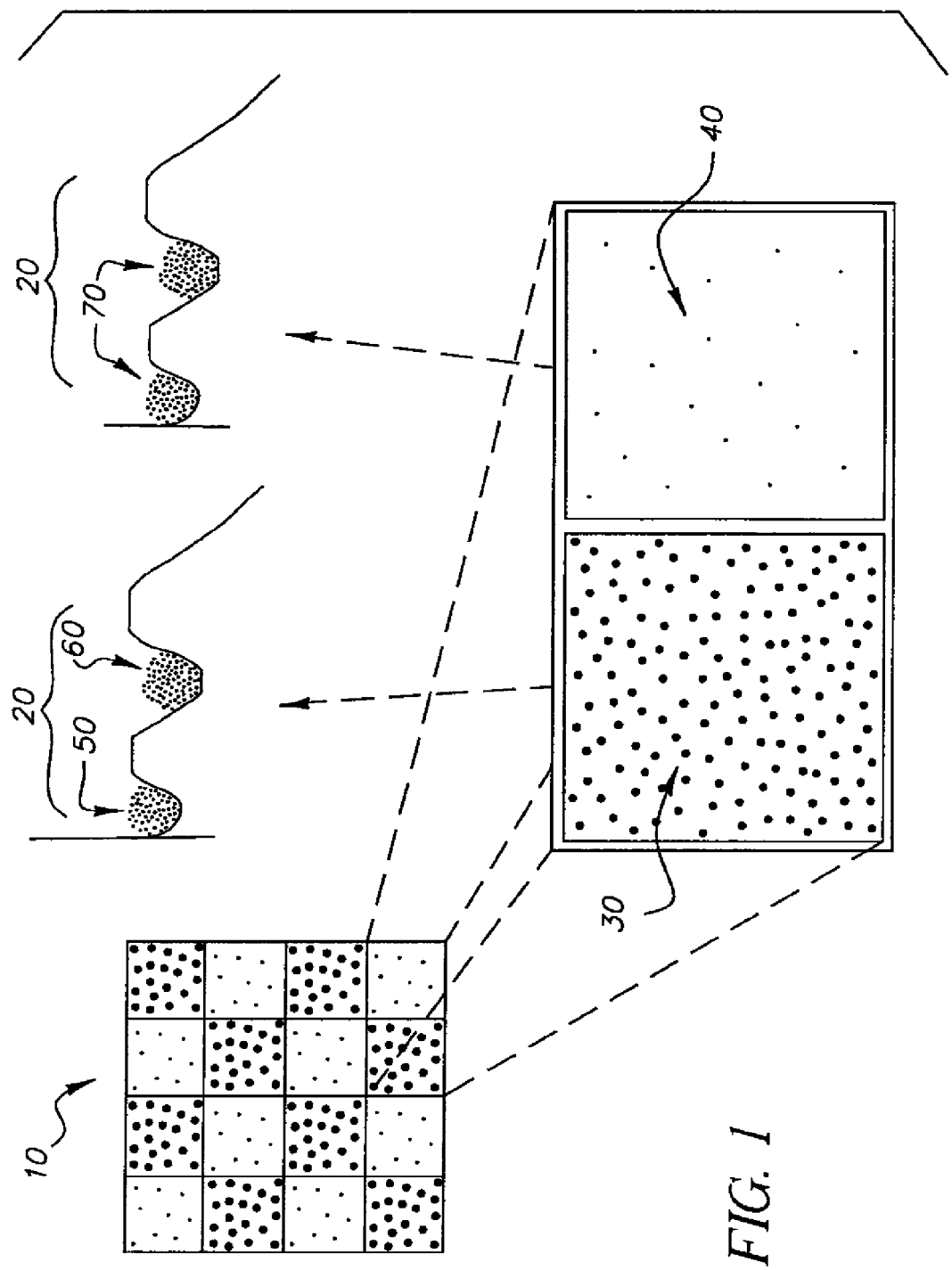
FIG. 1 is a top view of an image sensor of the present invention with an illustrated of its typical captured electrons.

Referring to FIG. 1, there is shown a top and side view of an image sensor of the present invention. The image sensor includes a color filter array 10 positioned covering a silicon substrate 20. The color filter 10 separates the incoming light into substantially distinct portions according to its wavelength so that different colors are absorbed at different wavelengths. In the preferred embodiment, a color filter 10 having an alternating pattern of magenta 30 and green 40 is used so that each pixel respectively receives the light permitted by its respective color filter, magenta and green filter in this embodiment. In this regard, the magenta 30 transmits the blue and red incoming light, and the silicon substrate releases electrons at different depths in the substrate and stores them at different charge locations respectively 50 and 60. The green filter 40 transmits the green light and the silicon substrate 20 releases electrons at a depth different or the same as the blue and red depth in the substrate and stores it at one or more charge locations 70.

Figure 2:
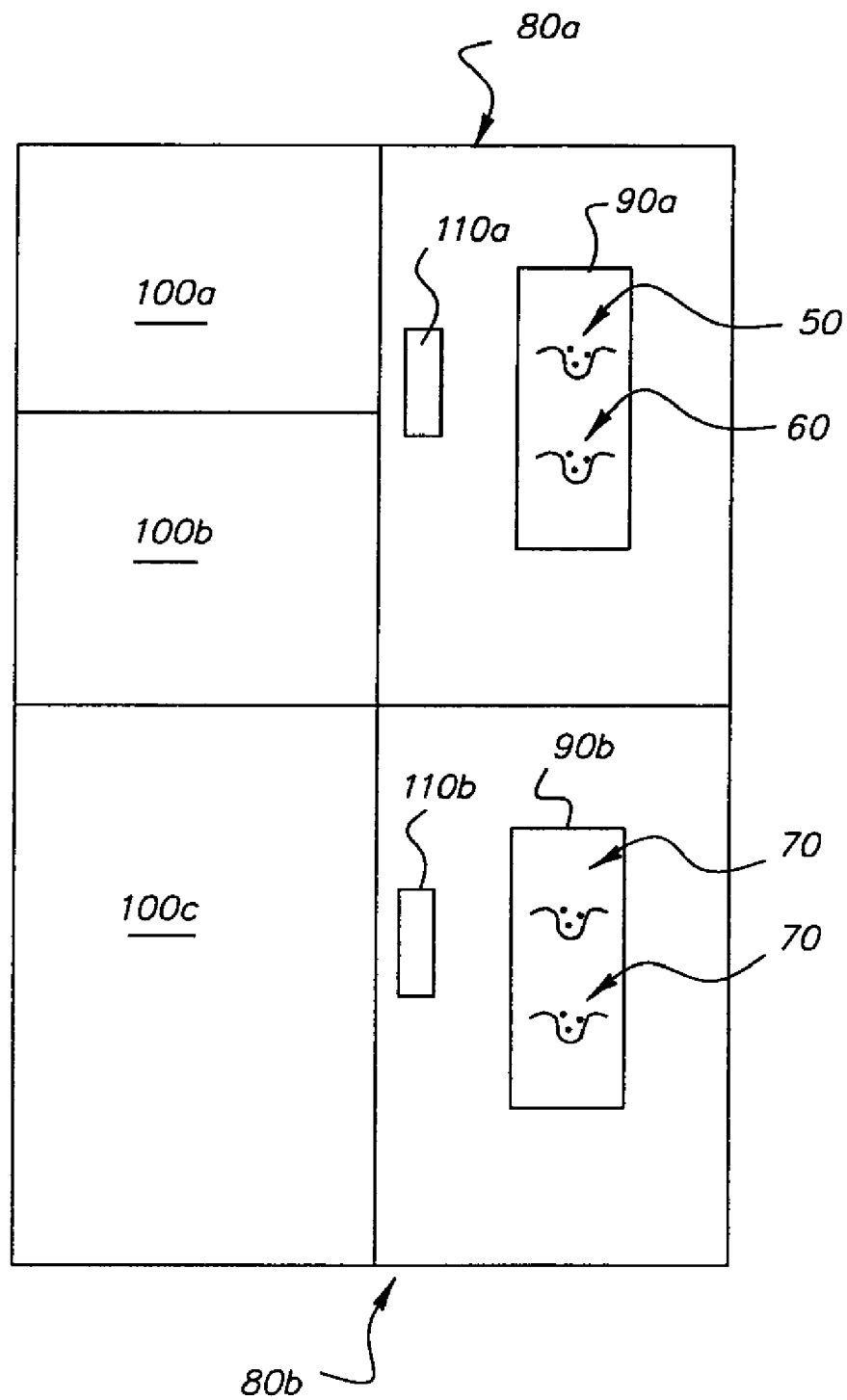
FIG. 2 is a top view of a portion of pixels of the image sensor of the present invention of FIG. 1.

Referring to FIG. 2, there is shown a top view of a plurality of pixels 80 of the image sensor of FIG. 1. Although only two pixels are shown, an image sensor includes an array of such pixels as is well known in the art. Each pixel 80 includes a photo sensitive area 90 adjacent to two charge-coupled devices 100. A transfer gate 110 spans a portion of the photo sensitive area 90 for transferring charge from the photo sensitive area 90 to their respective charge-coupled devices 100. In operation, the transfer gate 100a is energized at a first voltage level, for example +5 volts, for transferring the charge 50 (for example blue charge) in the photosensitive area 90a to its associated charge-coupled device 100a. The transfer gate 110a is energized at a second voltage level, for example +8 volts, for transferring charge 60 (for example red charge) from the photo sensitive area 90 to its associated charge coupled-device 100b. The other pixel 80b operates in substantially the same manner except that, when the transfer gate 110b is activated at the two different voltage levels, the charge 70 representative of only one color (for example green) is sequentially transferred from the photo sensitive area 90b to the same charge-couple device 100c.

The charge-coupled devices are then sequentially activated and de-activated for transferring the charge to a horizontal transfer mechanism (not shown), as is well known in the art.

Figure 3:
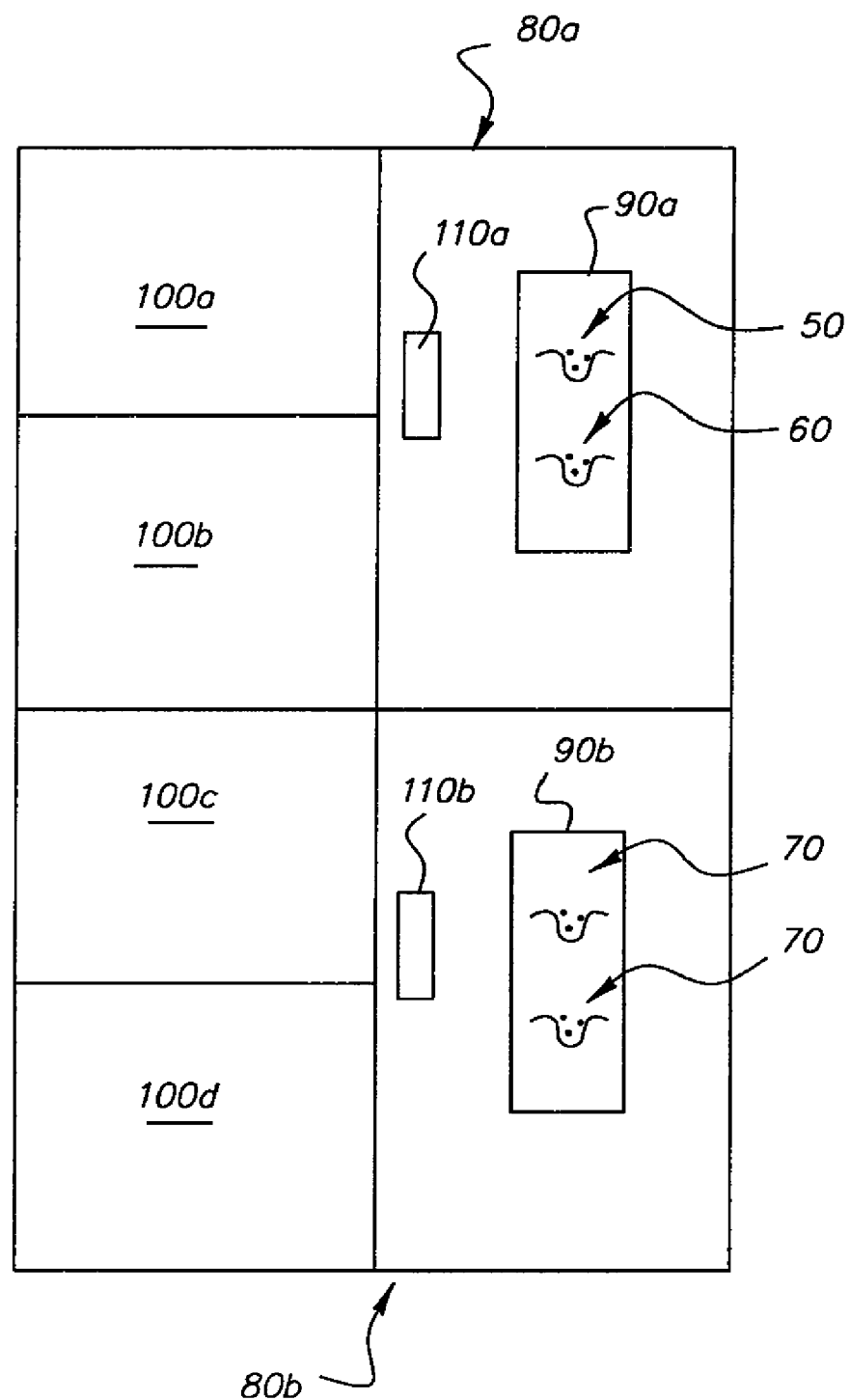
FIG. 3 is an alternative embodiment of FIG. 2.

Referring to FIG. 3, there is shown an alternative embodiment of FIG. 2. In this embodiment, pixel 80b is substantially the same except that the photosensitive area 90b is mated with two charge-coupled devices 100c and 100d. In this regard, the transfer gate 110b is sequentially energized at two different levels which, when at the first voltage, causes transfer of one charge 70 from the photosensitive area 90b to the charge-coupled device 100c. When the transfer gate 110b is energized at the second voltage level, the remaining charge 70 is transferred to charge-coupled device 100d.

Again, the charge-coupled devices 100 are then sequentially activated and de-activated for transferring the charge to a horizontal transfer mechanism (not shown), as is well known in the art.

Figure 4:
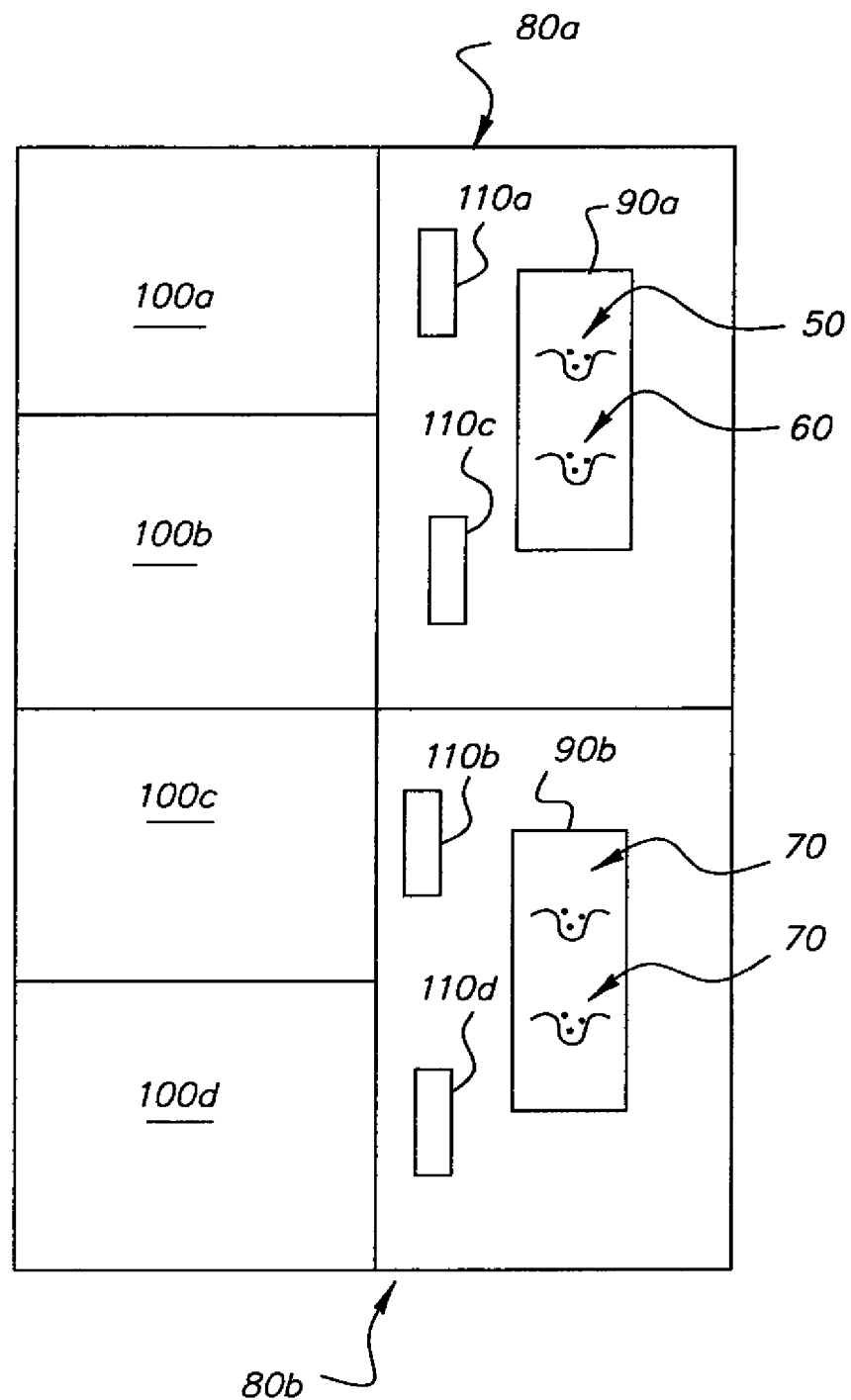
FIG. 4 is an alternative embodiment of FIG. 3.

Referring to FIG. 4, there is shown an alternative embodiment of FIG. 3. In this embodiment, the pixels 80 are the same as in FIG. 3 except that two transfer gates 110 are mated with each photosensitive area 90. In operation, instead of one transfer gate 110 being energized at two different levels, two transfer gates 110 are respectively and sequentially energized at the two different voltage levels. For example, for photo sensitive area 90a, transfer gates 110a and 110c are sequentially energized at two different levels for sequentially passing the charge 50 and 60 respectively to the charge-coupled devices 100a and 100b. Similarly, for photo sensitive area 90b, transfer gates 110b and 110d are sequentially energized at two different levels for sequentially passing the charge 70 respectively to the charge-coupled devices 100c and 100d. These charges are then passed to the horizontal transfer mechanism as described hereinabove.

Figure 5:
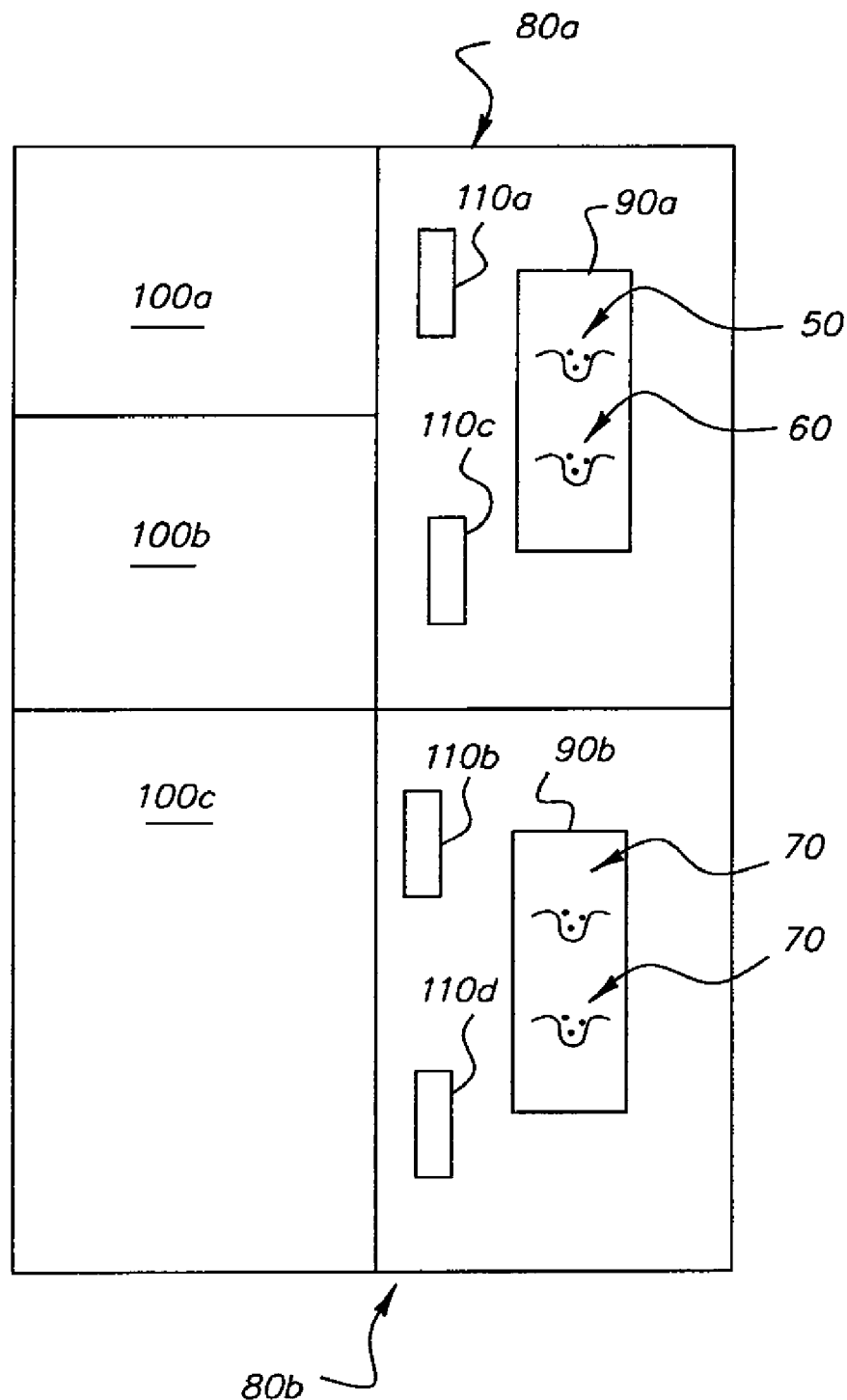
FIG. 5 is an alternative embodiment of FIG. 4.

Referring to FIG. 5, there is shown an alternative embodiment of FIG. 4. In this embodiment, it is the same as the embodiment of FIG. 4 except that photo sensitive area 90b is mated with one charge-coupled device 100c. Photo sensitive area 90a is the same as in FIG. 4, and photo sensitive area 90b transfers its two stored charge 70 sequentially to charge-coupled device 100c when transfer gates 110b and 110d is sequentially energized.

The invention has been described with reference to a preferred embodiment. However, it will be appreciated that variations and modifications can be effected by a person of ordinary skill in the art without departing from the scope of the invention.

PARTS LIST 10 color filter array
20 silicon substrate
30 magenta
40 green
50 charge location
60 charge location
70 charge location
80 plurality of pixels
90 photo sensitive areas
100 charge-coupled devices
110 transfer gates

What is claimed is:

1. An image sensor comprising:
   (a) at least first and second photosensitive regions;
   (b) a color filter array having at least two different colors that selectively absorb specific bands of wavelengths of light, and the at least two colors respectively span portions of predetermined photosensitive regions;
      wherein the first photosensitive region is doped so that charge representing one color is collected and stored in one depth region of the first photosensitive region and charge representing a different color is collected and stored at a separate depth region of the first photosensitive region and the second photosensitive region is doped so that charge representing one color is collected and stored in at least one depth region of the second photosensitive region;
   (c) at least a first charge-coupled device and a second charge-coupled device adjacent the first photosensitive region;
   (d) at least a third charge-coupled device and a fourth charge-coupled device adjacent the second photosensitive region;
   (e) at least two transfer gates associated with the first photosensitive region, wherein a first transfer gate selectively passes the charge representing the one color to the first charge-coupled device when energized at one voltage level and a second transfer gate selectively passes the charge representing the different color to the second charge-coupled device when energized at a different voltage level; and
   (f) at least two transfer gates associated with the second photosensitive region, wherein a third transfer gate selectively passes the charge representing the one color to the third charge-coupled device when energized at one voltage level and a fourth transfer gate selectively passes the charge representing the one color to the fourth charge-coupled device when energized at a different voltage level.

* * * * *

UNITED STATES PATENT AND TRADEMARK OFFICE
CERTIFICATE OF CORRECTION

| | | |
|---|---|---|
| PATENT NO. | : 7,830,440 B2 | Page 1 of 1 |
| APPLICATION NO. | : 12/168186 | |
| DATED | : November 9, 2010 | |
| INVENTOR(S) | : Joseph R. Summa et al. | |

It is certified that error appears in the above-identified patent and that said Letters Patent is hereby corrected as shown below:

Issued Patent                                        Description of Error

| Column | Line | |
|---|---|---|
| Title Page, Col. 1 (Related U.S. Application Data) (60) | 1 | Delete "Provisional" and insert -- Division of --, therefor. |

Signed and Sealed this
Twenty-third Day of August, 2011

David J. Kappos
*Director of the United States Patent and Trademark Office*